US008455918B2

(12) United States Patent
Adachi et al.

(10) Patent No.: US 8,455,918 B2
(45) **Date of Patent: *Jun. 4, 2013**

(54) ESD PROTECTION DEVICE AND METHOD FOR MANUFACTURING THE SAME

(75) Inventors: Jun Adachi, Koga (JP); Jun Urakawa, Omihachiman (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/115,221

(22) Filed: May 25, 2011

(65) Prior Publication Data

US 2011/0222203 A1 Sep. 15, 2011

Related U.S. Application Data

(63) Continuation of application No. PCT/JP2009/005463, filed on Oct. 19, 2009.

(30) Foreign Application Priority Data

Nov. 26, 2008 (JP) ................................ 2008-301643

(51) Int. Cl.
*H01L 29/66* (2006.01)

(52) U.S. Cl.
USPC ........... 257/173; 257/690; 257/693; 257/698; 361/56; 361/220

(58) Field of Classification Search
USPC .................... 257/690, 693, 173, 698; 361/56, 361/220
See application file for complete search history.

(56) References Cited

U.S. PATENT DOCUMENTS 7,633,735 B2 * 12/2009 Urakawa ....................... 361/112
8,238,069 B2 * 8/2012 Adachi et al. ................... 361/56

FOREIGN PATENT DOCUMENTS

| | | | |
|---|---|---|---|
| EP | 2 061 123 | A1 | 5/2009 |
| JP | 03-068389 | U | 7/1991 |
| JP | 03-194878 | A | 8/1991 |
| JP | 03-124585 | U | 12/1991 |
| JP | 10-208845 | A | 8/1998 |
| JP | 11-354926 | A | 12/1999 |
| JP | 2000-277229 | A | 10/2000 |
| JP | 2001-043954 | A | 2/2001 |
| JP | 2001-345161 | A | 12/2001 |
| JP | 2002-329872 | A | 11/2002 |
| JP | 2003-059616 | A | 2/2003 |
| JP | 2004-014466 | A | 1/2004 |
| JP | 2005-276666 | A | 10/2005 |
| WO | 2008/146514 | A1 | 12/2008 |

OTHER PUBLICATIONS

Official Communication issued in corresponding Japanese Patent Application No. 2010-510573, mailed on Jun. 28, 2012.
Official Communication issued in International Patent Application No. PCT/JP2009/005463, mailed on Dec. 22, 2009.

* cited by examiner

*Primary Examiner* — Thinh T Nguyen
(74) *Attorney, Agent, or Firm* — Keating & Bennett, LLP

(57) ABSTRACT

An ESD protection device is manufactured such that its ESD characteristics are easily adjusted and stabilized. The ESD protection device includes an insulating substrate, a cavity provided in the insulating substrate, at least one pair of discharge electrodes each including an exposed portion that is exposed in the cavity, and external electrodes provided on a surface of the insulating substrate and connected to the discharge electrodes. Supporting electrodes obtained by dispersing conductive powder in an insulating material defining the insulating substrate are provided along a bottom surface and a top surface that define the cavity between the exposed portions of the at least one pair of discharge electrodes.

4 Claims, 5 Drawing Sheets

ESD PROTECTION DEVICE AND METHOD FOR MANUFACTURING THE SAME

BACKGROUND OF THE INVENTION

1. Field of the Invention

The present invention relates to an electrostatic discharge (ESD) protection device and a method for manufacturing the ESD protection device. In particular, the present invention relates to an ESD protection device having improved ESD characteristics and reliability in which discharge electrodes are disposed in a cavity of an insulating substrate so as to face each other.

2. Description of the Related Art

ESD is a phenomenon in which strong discharge is generated when a charged conductive body (e.g., human body) comes into contact with or comes sufficiently close to another conductive body (e.g., electronic device). ESD causes damage or malfunctioning of electronic devices. To prevent this, it is necessary to prevent an excessively high voltage generated during discharge from being transmitted to circuits of the electronic devices. ESD protection devices, which are also called surge absorbers, are used for such an application.

An ESD protection device is disposed, for instance, between a signal line and a ground of the circuit. The ESD protection device includes a pair of discharge electrodes facing each other with a space provided therebetween. Therefore, the ESD protection device has relatively high resistance under normal operation and a signal is not sent to the ground. An excessively high voltage, for example, generated by static electricity through an antenna of a mobile phone causes discharge between the discharge electrodes of the ESD protection device, which leads the static electricity to the ground. Thus, a voltage generated by static electricity is not applied to the circuits disposed downstream from the ESD protection device, which protects the circuits.

For example, an ESD protection device shown in an exploded perspective view of FIG. 8 and a sectional view of FIG. 9 includes a cavity 5 provided in a ceramic multilayer substrate 7 including a plurality of laminated insulating ceramic sheets 2. Discharge electrodes 6 arranged to face each other and electrically connected to external electrodes 1 are disposed in the cavity 5 that includes a discharge gas. When a breakdown voltage is applied between the discharge electrodes 6, discharge is generated between the discharge electrodes 6 in the cavity 5, which leads an excessive voltage to the ground. Consequently, the circuits disposed downstream from the ESD protection device are protected (see, for example, Japanese Unexamined Patent Application Publication No. 2001-43954).

However, in such an ESD protection device, the responsivity to ESD easily varies due to the variation in the space between the discharge electrodes. Furthermore, although the responsivity to ESD needs to be adjusted using an area of the region sandwiched between discharge electrodes that face each other, the adjustment has limitation due to the size of the product. Therefore, it may be difficult to achieve desired responsivity to ESD.

SUMMARY OF THE INVENTION

To overcome the problems described above, preferred embodiments of the present invention provide an ESD protection device whose ESD characteristics are easily adjusted and stabilized and a method for manufacturing the ESD protection device.

An ESD protection device according to a preferred embodiment of the present invention preferably includes an insulating substrate, a cavity provided in the insulating substrate, at least a pair of discharge electrodes each including an exposed portion that is exposed in the cavity, and external electrodes provided on a surface of the insulating substrate and connected to the discharge electrodes. In the ESD protection device, supporting electrodes in which conductive powder is dispersed are provided along a bottom surface and a top surface that define the cavity between the exposed portions of the discharge electrodes.

In the above-described structure, when a voltage equal to or greater than a certain voltage is applied between the external electrodes, discharge is generated between the discharge electrodes arranged to face each other. This discharge is primarily a creeping discharge generated at an interface between the cavity and the insulating substrate. Since the supporting electrodes including conductive powder are provided along the bottom surface and the top surface that define the cavity, electrons easily move and, thus, discharge is generated more efficiently, which improves the responsivity to ESD. Therefore, a variation in the responsivity to ESD due to the variation in the space between the discharge electrodes is significantly reduced. Accordingly, ESD characteristics are easily adjusted and stabilized.

Furthermore, since the supporting electrodes arranged to generate creeping discharge are preferably provided on the bottom surface and the top surface of the cavity, the responsivity to ESD can be further improved as compared to a case in which a supporting electrode is provided along only one of the bottom surface and the top surface.

The distance between the bottom surface and the top surface that define the cavity is preferably equal or substantially equal to the thickness of the discharge electrodes.

In this case, by decreasing the height of the cavity, creeping discharge is generated more easily than gaseous discharge (discharge between discharge electrodes). Consequently, the responsivity to ESD is further improved.

The insulating substrate is preferably a ceramic substrate.

In this case, the ESD protection device is easily manufactured.

The supporting electrodes are preferably formed by dispersing the conductive powder and an insulating material.

In this case, since the contact between conductive powder particles is prevented by the insulating material, the generation of short circuits is prevented. The adhesiveness of the supporting electrodes to the substrate body is also improved.

A method for manufacturing an ESD protection device according to another preferred embodiment of the present invention preferably includes a first step of forming supporting electrodes by attaching a material in which conductive powder is dispersed to one principal surface of a first insulating layer and one principal surface of a second insulating layer, a second step of forming at least a pair of discharge electrodes on the one principal surface of the first insulating layer, the discharge electrodes being separated from each other, so that at least a portion of the supporting electrode formed on the one principal surface of the first insulating layer is exposed between the discharge electrodes, a third step of laminating the first insulating layer and the second insulating layer while the one principal surface of the first insulating layer faces the one principal surface of the second insulating layer, and a fourth step of forming external electrodes connected to the discharge electrodes on a surface of a laminated body obtained through the third step. In the method, a cavity is preferably formed inside the laminated body between the first insulating layer and the second insulating layer lating layer, and at least portions of the pair of discharge electrodes are exposed in the cavity.

According to the above-described method, the supporting electrodes are easily formed along the bottom surface and the top surface that define the cavity.

In the second step, a cavity formation layer including a material to be eliminated is preferably formed on the at least a portion of the supporting electrode to be exposed between the discharge electrodes. In the third step, after the second insulating layer is disposed on the cavity formation layer, the cavity is preferably formed by eliminating at least a portion of the cavity formation layer.

In this case, the detachment of the supporting electrodes can be prevented by the presence of the cavity formation layer, and a cavity can be formed with greater certainty. The cavity formation layer is preferably composed of a material, such as resin paste or carbon paste, for example, that is eliminated during the firing of a laminate produced through the fourth step.

In the first step, the supporting electrodes are preferably formed by xerography, for example.

In this case, the supporting electrodes in which conductive powder is uniformly dispersed can be easily formed, and short circuits can be prevented by reliably providing a space between conductive powder particles. As a result, stable responsivity to ESD is achieved.

According to various preferred embodiments of the present invention, ESD characteristics of ESD protection devices are easily adjusted and stabilized.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will now be described with reference to FIGS. 1 to 6.

Figure 1:
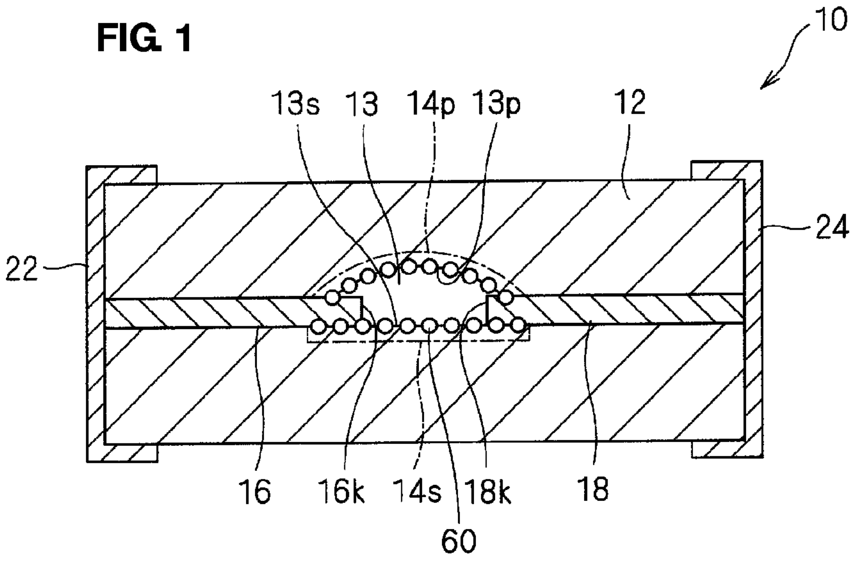
FIG. 1 is a sectional view of an ESD protection device according to a preferred embodiment of the present invention.

An ESD protection device 10 according to a first preferred embodiment of the present invention will be described with reference to FIGS. 1 to 3D. FIG. 1 is a sectional view of the ESD protection device 10.

As shown in FIG. 1, the ESD protection device 10 preferably includes a cavity 13 provided in a substrate body 12 of an insulating substrate, such as a ceramic multilayer substrate or a resin substrate, for example. A pair of discharge electrodes 16 and 18 are disposed such that the respective edges 16*k* and 18*k* are exposed in the cavity 13. The edges 16*k* and 18*k* of the discharge electrodes 16 and 18 are arranged so as to face each other with a space provided therebetween. The discharge electrodes 16 and 18 extend to the outer circumferential surface of the substrate body 12 and are respectively connected to external electrodes 22 and 24 provided on the surface of the substrate body 12. The external electrodes 22 and 24 are used to implement the ESD protection device 10.

As schematically shown in FIG. 1, supporting electrodes 14*p* and 14*s* obtained by dispersing conductive powder 60 in an insulating material defining the substrate body 12 are provided in the substrate body 12 in a region indicated by chain lines extending along a top surface 13*p* and a bottom surface 13*s* that define the cavity 13.

In the ESD protection device 10, when a voltage equal to or greater than a certain voltage is applied between the external electrodes 22 and 24, discharge is generated in the cavity 13 between the discharge electrodes 16 and 18 that face each other. This discharge is primarily a creeping discharge generated at an interface between the cavity 13 and the substrate body 12. For this interface, since the supporting electrodes 14*s* and 14*p* including the conductive powder 60 are provided along the bottom surface 13*s* and the top surface 13*p* that define the cavity 13, electrons easily move and, thus, discharge can be generated more efficiently. This decreases the variation in the responsivity to ESD caused by a variation in the space between the discharge electrodes. Thus, ESD characteristics are easily adjusted and stabilized.

When the supporting electrodes 14*p* and 14*s* include an insulating material together with conductive powder, short circuits are prevented because the contact between conductive powder particles is prevented by the insulating material. Furthermore, when the insulating material is the same material as that of the substrate body, the adhesiveness of the supporting electrodes to the substrate body is improved.

The discharge electrodes 16 and 18 are arranged such that the respective edges 16*k* and 18*k* exposed in the cavity 13 are located in the same or substantially the same plane. The bottom surface 13*s* and the top surface 13*p* that define the cavity 13 are disposed on both sides of the same or substantially the same plane.

A method for manufacturing the ESD protection device 10 will now be described with reference to a sectional view of a principal portion of FIG. 2 and schematic views of FIGS. 3A to 3D.

First, materials for forming a substrate body 12, discharge electrodes 16 and 18, and a cavity 13 are produced.

A ceramic green sheet for forming the substrate body 12 is produced. A material primarily including Ba, Al, and Si (BAS material) is preferably used as a ceramic material. Raw materials are prepared and mixed so that the mixture has a desired composition. The mixture is then calcined at about 800° C. to about 1000° C. to obtain calcined powder. The calcined powder is pulverized using a zirconia ball mill for about 12 hours to obtain ceramic powder. The BAS material-calcined ceramic powder is mixed with an organic solvent, such as toluene or ethanol, for example. The mixture is further mixed with a binder and a plasticizer to obtain a slurry. The obtained slurry is formed into ceramic green sheets preferably having a desired thickness of about 10 μm to about 50) on a PET film by a doctor blade method.

An electrode paste for forming the discharge electrodes 16 and 18 is produced. A solvent is added to about 80 wt % Cu powder having an average particle size of about 2 μm and a binder resin composed of ethyl cellulose, for example. The admixture is then stirred and mixed to obtain an electrode paste.

A resin paste used for forming the cavity 13 is produced. The resin paste includes only a resin and a solvent and is produced in the same manner as the electrode paste. Examples of the resin material include PET, polypropylene, ethyl cellulose, and acrylic resins, for example, which are eliminated through combustion, decomposition, fusion, or vaporization, when fired.

Figure 2:
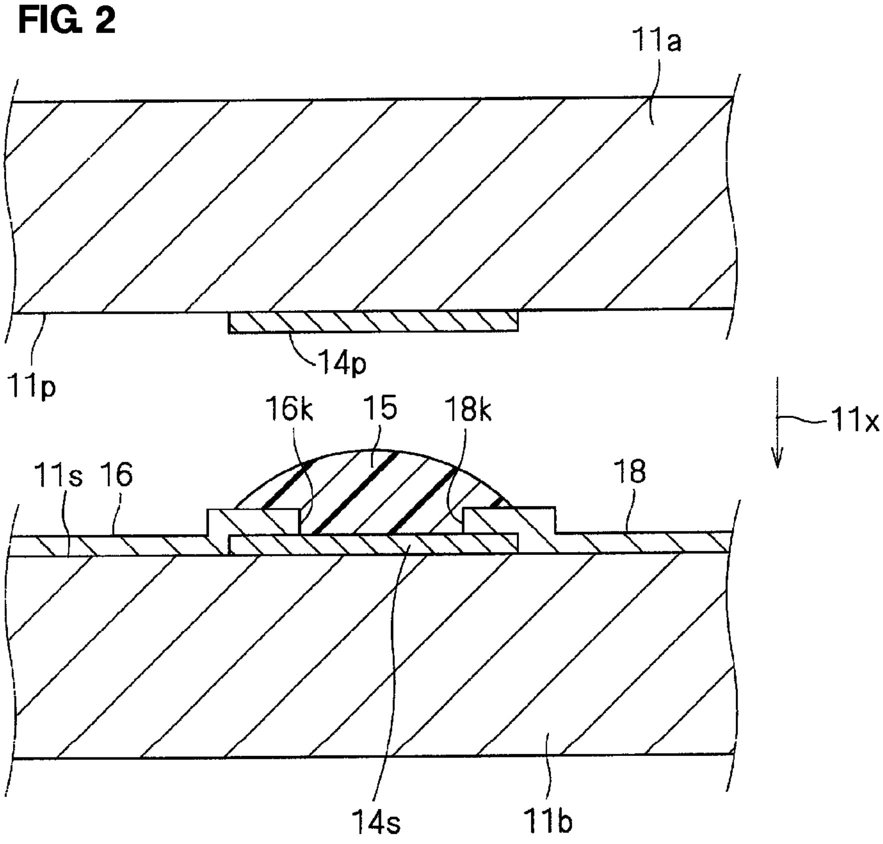
FIG. 2 is a sectional view showing a step of manufacturing supporting electrodes according to a preferred embodiment of the present invention.

As shown in FIG. 2, supporting electrodes 14*p* and 14*s* are formed, by screen printing or xerography, for example, on surfaces 11*p* and 11*s*, which are respectively principal surfaces of ceramic green sheets 11*a* and 11*b*. The ceramic green sheet 11*a* including the supporting electrode 14*p* formed thereon is used on the top surface side and the ceramic green sheet 11*b* including the supporting electrode 14*s* formed thereon is used on the bottom surface side.

When screen printing is performed, a paste for forming supporting electrodes is produced, and a supporting electrode is formed using the paste.

Typical four types of pastes for forming supporting electrodes are produced by the following methods.

Figure 3A:
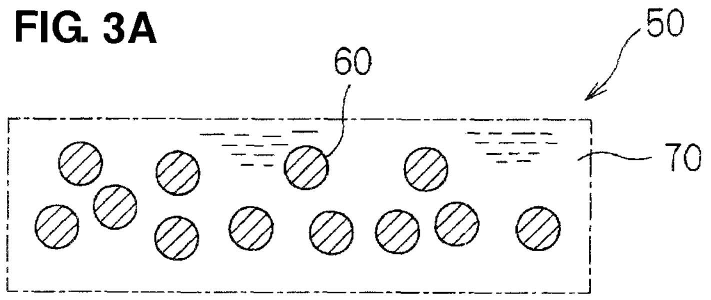
FIGS. 3A to 3D are schematic views of pastes used in a preferred embodiment of the present invention.

As schematically shown in FIG. 3A, a paste 50 is preferably obtained by preparing Cu powder 60 having an average particle size of about 3 μm, for example, adding a binder resin and a solvent 70, and stirring and mixing the admixture. Preferably, the content of the resin and the solvent is set to about 70 wt % and the content of the Cu powder is set to about 30 wt %. The paste 50 is preferably produced so as to have a viscosity (i.e., about 30 Pa·s) less than that of a typical electrode paste (i.e., about 80 Pa·s). Since the paste 50 has a low content of the Cu powder 60, an insulating property is maintained even after the paste 50 is fired.

Figure 3B:
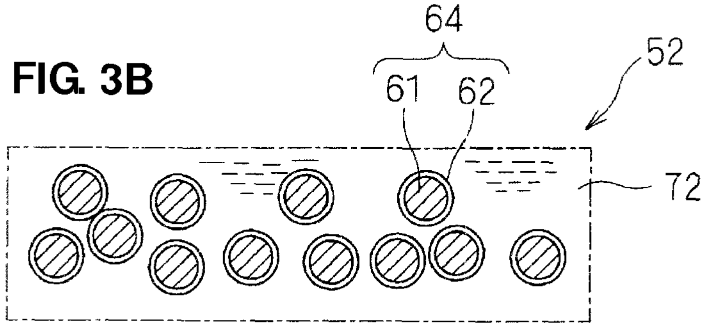

As schematically shown in FIG. 3B, a paste 52 is preferably obtained by preparing $Al_2O_3$-coated Cu powder 64 having an average particle size of about 3 μm, for example, adding a binder resin and a solvent 72, and stirring and mixing the admixture. The $Al_2O_3$-coated Cu powder 64 is formed by coating Cu powder 61 with an $Al_2O_3$-coating layer 62. Preferably, the content of the resin and the solvent 72 is set to about 50 wt % and the content of the $Al_2O_3$-coated Cu powder 64 is set to about 50 wt %. The paste 52 is preferably produced so as to have a viscosity (i.e., about 30 Pa·s) less than that of a typical electrode paste (i.e., about 80 Pa·s). Since the paste 52 includes the $Al_2O_3$-coated Cu powder 64, an insulating property is maintained even after the paste 52 is fired.

Figure 3C:
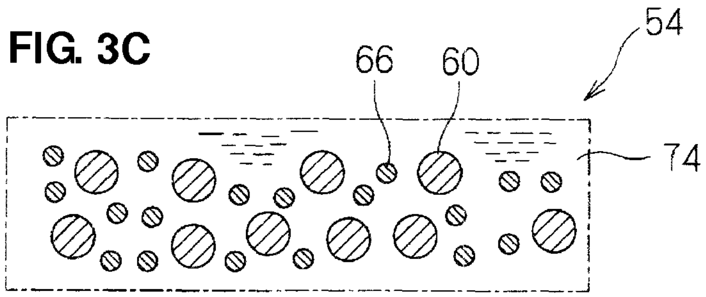

As schematically shown in FIG. 3C, a paste 54 is preferably obtained by preparing Cu powder 60 having an average particle size of about 3 μm, for example, and BAS material-calcined ceramic powder 66 in a certain ratio, adding a binder resin and a solvent 74, and stirring and mixing the admixture. Preferably, the content of the resin and the solvent 74 is set to about 40 wt %, the content of the Cu powder 60 is set to about 40 wt %, and the content of the ceramic powder 66 is set to about 20 wt %. The paste 54 is preferably produced so as to have a viscosity (i.e., about 30 Pa·s) less than that of a typical electrode paste (i.e., about 80 Pa·s). Since the paste 54 includes the ceramic powder 66 in addition to the Cu powder 60, an insulating property is maintained even after the paste 54 is fired.

Figure 3D:
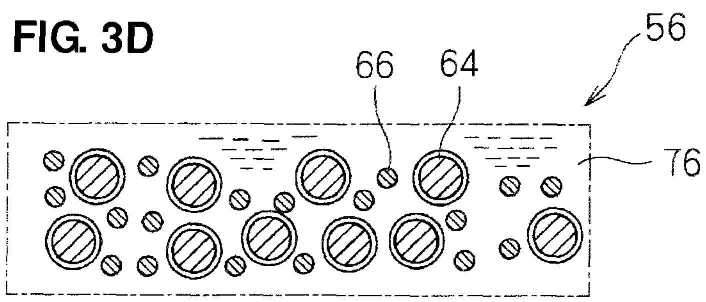

As schematically shown in FIG. 3D, a paste 56 is preferably obtained by preparing $Al_2O_3$-coated Cu powder 64 having an average particle size of about 3 μm, for example, and BAS material-calcined ceramic powder 66 in a certain ratio, adding a binder resin and a solvent 76, and stirring and mixing the admixture. The content of the resin and the solvent 76 is set to about 40 wt %, the content of the $Al_2O_3$-coated Cu powder 64 is set to about 50 wt %, and the content of the ceramic powder 66 is set to about 10 wt %. The paste 56 is preferably produced so as to have a viscosity (i.e., about 30 Pa·s) less than that of a typical electrode paste (i.e., about 80 Pa·s). Since the paste 56 includes the $Al_2O_3$-coated Cu powder 64 and the ceramic powder 66, an insulating property is maintained even after the paste 56 is fired.

The supporting electrode is formed by applying the paste for forming supporting electrodes on the ceramic green sheet by screen printing.

The supporting electrode itself has an insulating property even after the firing.

When the supporting electrode is formed by xerography, first, a conductive powder toner is produced as a material for forming supporting electrodes, and a supporting electrode is formed using the toner.

The toner is produced as follows:

1. Cu powder preferably having an average particle size of about 3 μm is mixed with a resin and the surface of the Cu powder is coated with the resin using a surface treatment apparatus;

2. The sample obtained through the above-described process 1 is classified to remove fine powder and coarse powder;

3. The capsule Cu powder obtained through the above-described process 2 is mixed with a surface additive, and the surface additive is uniformly attached to the surface of the capsule Cu powder using a surface treatment apparatus; and 4. The capsule Cu powder obtained through the above-described process 3 is mixed with a carrier to obtain a toner that functions as a developer.

The supporting electrode is formed as follows:

1. A photoconductor is uniformly charged;

2. The charged photoconductor is irradiated with light using an LED in a shape of a supporting electrode to form a latent image;

3. A toner is developed on the photoconductor by applying a developing bias (the amount of toner applied can be controlled by the magnitude of the developing bias);

4. A ceramic green sheet is disposed on the photoconductor on which a pattern of a supporting electrode has been developed to transfer the toner to the ceramic green sheet; and 5. The ceramic green sheet to which the pattern of a supporting electrode has been transferred is inserted into an oven to fix the toner and thus a ceramic green sheet on which the pattern of a supporting electrode is formed is produced.

The supporting electrode itself has an insulating property even after the firing.

With xerography, a supporting electrode having conductive powder uniformly dispersed therein can be easily produced and short circuits are prevented by reliably providing a space between conductive powder particles so as to achieve stable responsivity to ESD.

When an ink jet method is performed, an ink including Cu particles, that is, a material for forming supporting electrodes is applied on a ceramic green sheet by an ink jet method.

The supporting electrode itself has an insulating property even after the firing.

As shown in FIG. 2, the electrode paste is applied by screen printing on the ceramic green sheet 11*b* on which the discharge electrode 14*s* of the bottom surface side has been formed to form discharge electrodes 16 and 18 having a discharge gap between the respective edges 16*k* and 18*k*.

As the manufacturing method described below, belt-shaped discharge electrodes were formed so that the width of the discharge electrodes was preferably about 100 μm and the discharge gap (the distance between the edges of the discharge electrodes facing each other) was preferably about 30 μm, for example.

Furthermore, the resin paste is applied at a position at which a cavity is to be formed to form a cavity formation layer 15. The resin paste will be eliminated during the firing performed later and, thus, a cavity is formed at the position at which the resin paste has been applied. By adjusting the height of the cavity formation layer 15 in accordance with the amount of the resin paste applied, the height of the cavity to be finally formed in the substrate body can be controlled.

As indicated by arrow 11*x* of FIG. 2, the ceramic green sheets 11*a* and 11*b* are laminated while the surfaces 11*p* and 11*s* of the ceramic green sheets 11*a* and 11*b* on which the supporting electrodes 14*p* and 14*s* have been formed face each other. The ceramic green sheets 11*a* and 11*b* are then press-bonded to form a laminated body. Herein, the supporting electrodes are pressed against the ceramic green sheets due to the presence of the cavity formation layer. This effectively prevents the detachment of the supporting electrodes and forms a cavity with certainty.

In a manufacturing method described below, the ceramic green sheets were laminated so that the laminated body preferably had a thickness of about 0.35 mm, for example, and the discharge electrodes and the cavity were arranged in the middle in the thickness direction.

When a laminated body including a plurality of ESD protection devices is formed, the laminated body is cut into pieces of chips using a mold in substantially the same manner as chip-type components such as LC filters. In the manufacturing method described below, the laminated body was cut so that each of the chips have a size of about 1.0 mm×about 0.5 mm. Subsequently, the electrode paste was applied to the end surfaces of each of the chips to form external electrodes.

The chip having external electrodes formed thereon is fired preferably in a $N_2$ atmosphere in substantially the same manner as typical multilayer components. The resin paste sandwiched between the ceramic green sheets is eliminated during the firing and, thus, a cavity 13 is formed. If an inert gas, such as Ar or Ne, for example, is introduced into the cavity 13 to decrease the response voltage to ESD, the chip can be fired in an atmosphere of the inert gas such as Ar or Ne in a temperature range in which a ceramic material is shrunk and sintered. If the electrode material (e.g., Ag) is not oxidized, the firing may be performed in the air.

Ni—Sn electroplating is preferably performed on the external electrodes of the fired chip in substantially the same manner as chip-type components such as LC filters.

Through the steps described above, an ESD protection device is produced.

By manufacturing the ESD protection device using a ceramic substrate as described above, the discharge electrodes are easily formed along the bottom surface and the top surface that define the cavity.

The ceramic material of the substrate body 12 is not particularly limited to the material described above as long as the ceramic material has an insulating property. Therefore, such a ceramic material may be a mixture of forsterite and glass, a mixture of $CaZrO_3$ and glass, or other suitable material, for example.

Instead of Cu, the electrode material of the discharge electrodes 16 and 18 may be Ag, Pd, Pt, Al, Ni, W, or a combination thereof, for example.

The conductive powder used for the supporting electrode 14 preferably includes at least one metal selected from the group of transition metals such as Cu, Ni, Co, Ag, Pd, Rh, Ru, Au, Pt, and Ir, for example. These metals can be used alone or in combination as an alloy. An oxide of these metals or a semiconductor material, such as SiC, for example, may also be used.

Furthermore, a material obtained by coating these metals with an inorganic material such as $Al_2O_3$, $ZrO_2$, or $SiO_2$ or with a mixed calcined material, such as BAS, for example, may be used. Alternatively, a material obtained by coating these metals with an organic material such as a resin may be used. Such coated powder prevents contact between conductive powder particles and improves the resistance to short circuits.

The conductive powder of the supporting electrodes preferably has an average particle size of about 0.05 μm to about 10 μm, and more preferably about 0.1 μm to about 5 μm, for example. The surface area of the conductive powder exposed in the cavity is increased as the particle size is decreased. This decreases the discharge starting voltage, improves the responsivity to ESD, and reduces the degradation.

The resin paste preferably has been used to form the cavity 13. However, a material, such as carbon that is eliminated when fired, may be used instead of a resin.

An ESD protection device 10*a* according to a second preferred embodiment of the present invention will now be described with reference to FIG. 4.

The ESD protection device 10*a* according to the second preferred embodiment preferably has substantially the same structure as that of the ESD protection device 10 according to the first preferred embodiment. Hereinafter, the same element and components as those in the first preferred embodiment are designated by the same reference numerals, and the differences between the first and second preferred embodiments will be primarily described.

Figure 4:
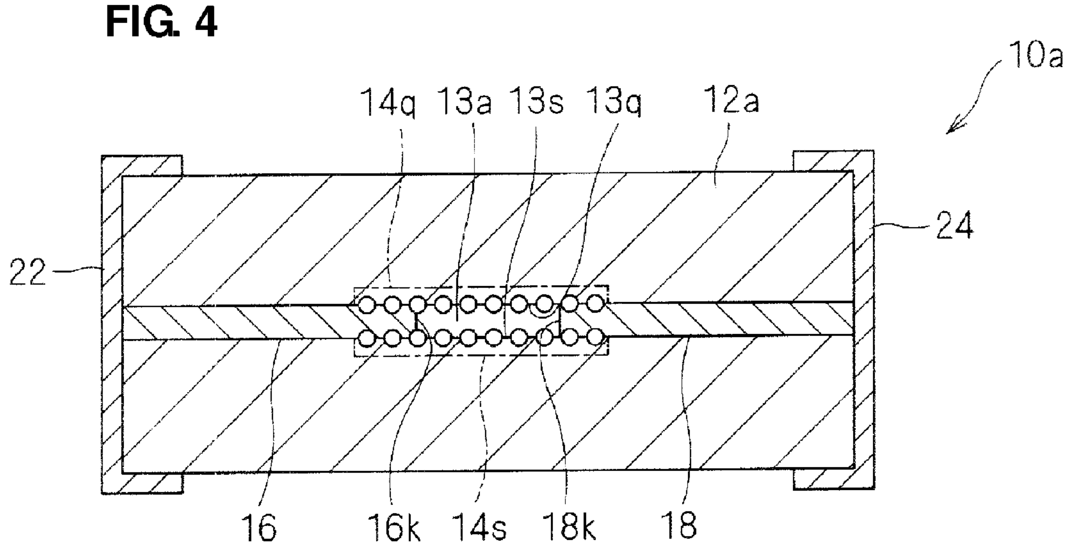
FIG. 4 is a sectional view of an ESD protection device according to another preferred embodiment of the present invention.

FIG. 4 is a sectional view of the ESD protection device 10*a*. As shown in FIG. 4, in the ESD protection device 10*a*, the height of a cavity 13*a* provided in a substrate body 12*a* is preferably equal or substantially equal to the thickness of discharge electrodes 16 and 18. In other words, the distance between a bottom surface 13*s* and a top surface 13*q* that define the cavity 13*a* is preferably equal or substantially to the thickness of the discharge electrodes 16 and 18.

The height of the cavity 13*a* may be equal or substantially equal to the thickness of the discharge electrodes 16 and 18 by adjusting the thickness of a cavity formation layer that is formed before ceramic green sheets are laminated.

An ESD protection device 10*b* according to a third preferred embodiment of the present invention will now be described with reference to FIG. 5.

Figure 5:
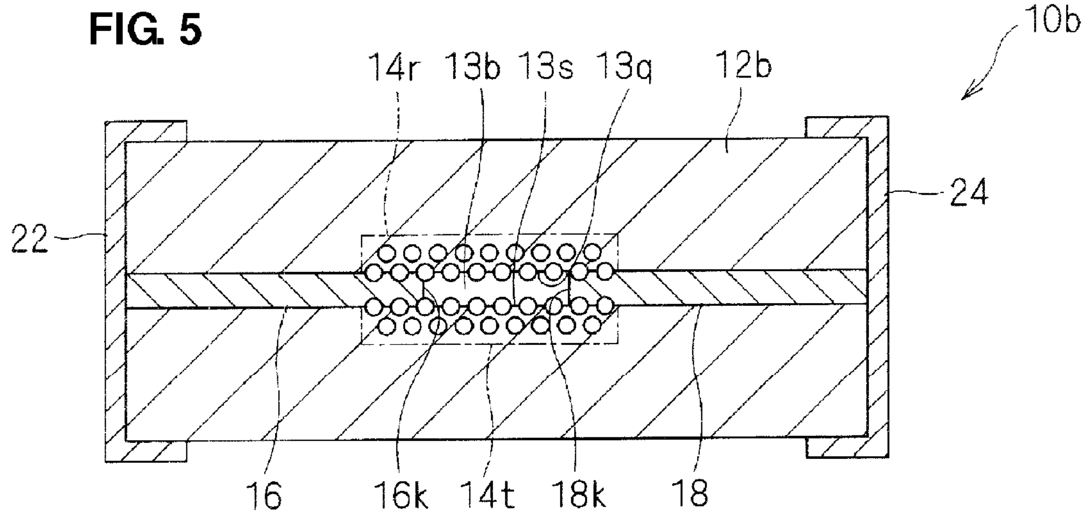
FIG. 5 is an enlarged sectional view of a principal portion of supporting electrodes according to another preferred embodiment of the present invention.

As shown in a sectional view of FIG. 5, the ESD protection device 10*b* according to the third preferred embodiment has substantially the same structure as that of the ESD protection device 10*a* according to the second preferred embodiment.

As schematically shown in FIG. 5, the thickness of supporting electrodes 14*r* and 14*t* respectively provided along a top surface 13*q* and a bottom surface 13*s* of a cavity 13*b* is greater than the thickness of the supporting electrodes 14*q* and 14*s* of the ESD protection device 10*a* of the second preferred embodiment. By increasing the thickness of the supporting electrodes 14*r* and 14*t*, a high degree of responsivity to ESD is maintained even if discharge is repeatedly generated.

The supporting electrodes 14*r* and 14*t* may be formed with a large thickness by, for example, increasing the amount of a supporting electrode paste applied or repeatedly performing the formation of the supporting electrode and stacking the supporting electrodes on top of one another. In a manufacturing method of the ESD protection device 10*b* of the third preferred embodiment described below, the supporting electrodes 14*r* and 14*t* were formed preferably by performing screen printing twice. In the manufacturing method of the ESD protection device 10 of the first preferred embodiment, the supporting electrodes 14*p* and 14*s* were formed preferably by performing screen printing once.

An ESD protection device 10*x* of Comparative Example 1 will now be described with reference to FIG. 6.

Figure 6:
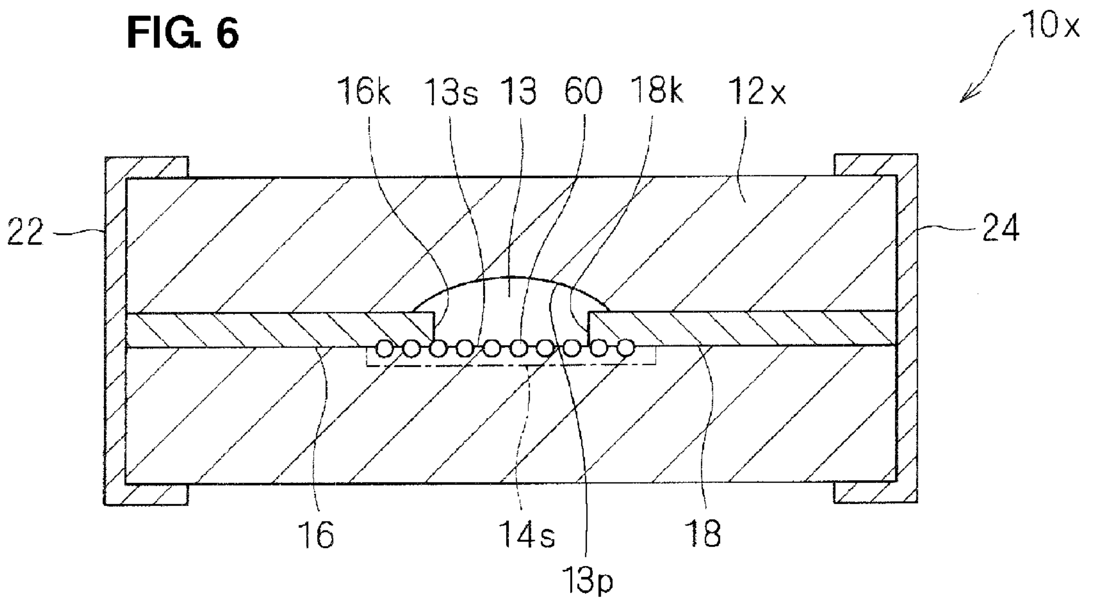
FIG. 6 is an enlarged sectional view of a principal portion of a supporting electrode of Comparative Example 1.

As shown in a sectional view of FIG. 6, the ESD protection device 10*x* of Comparative Example 1 has substantially the same structure as that of the ESD protection device 10 of the first preferred embodiment. The height of a cavity 13 provided in a substrate body 12*x* is greater than the thickness of discharge electrodes 16 and 18. Herein, Comparative Example 1 differs from the first preferred embodiment in that a supporting electrode 14*s* is only provided along a bottom surface 13*s* of the cavity 13 between discharge electrodes 16 and 18 and a supporting electrode is not provided on the top surface 13*p*.

An ESD protection device 10*y* of Comparative Example 2 will now be described with reference to FIG. 7.

Figure 7:
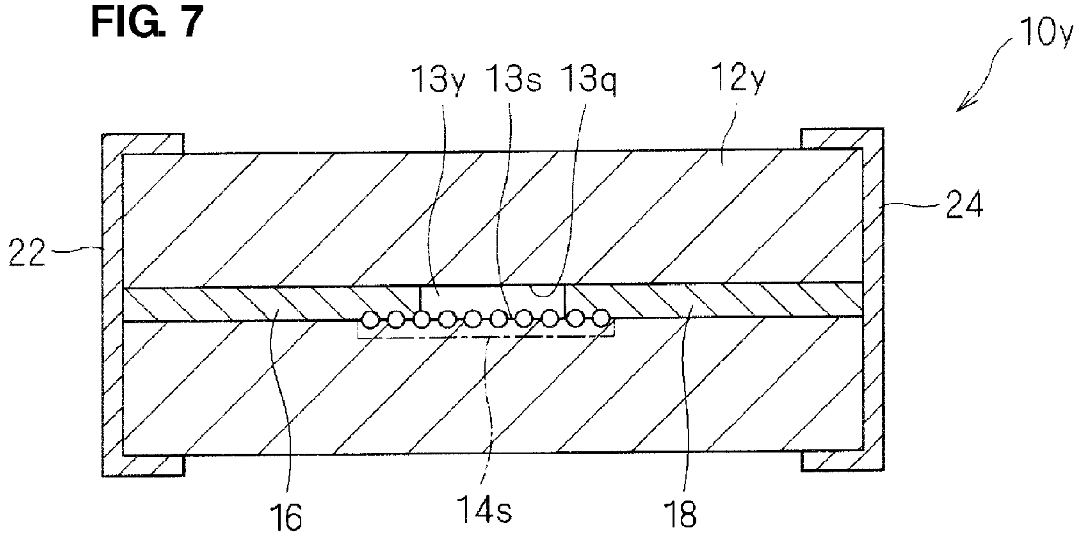
FIG. 7 is an enlarged sectional view of a principal portion of a supporting electrode of Comparative Example 2.
Figure 8:
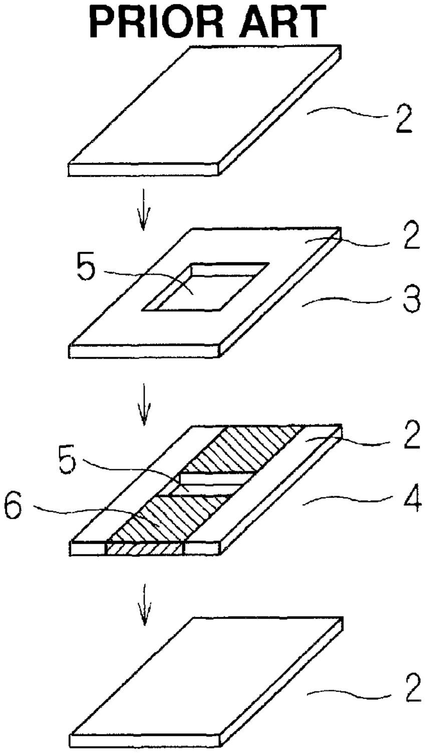
FIG. 8 PRIOR ART
FIG. 8 is an exploded perspective view of a conventional ESD protection device.
Figure 9:
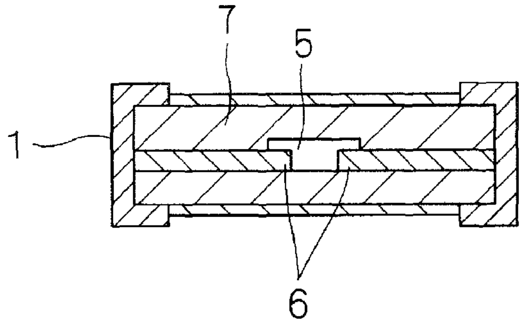
FIG. 9 PRIOR ART
FIG. 9 is a sectional view of the conventional ESD protection device shown in FIG. 8.

As shown in a sectional view of FIG. 7, the ESD protection device 10*y* of Comparative Example 2 has substantially the same structure as that of the ESD protection device 10*a* of the second preferred embodiment. The height of a cavity 13*a* provided in a substrate body 12*y* is equal or substantially equal to the thickness of discharge electrodes 16 and 18. Herein, Comparative Example 2 differs from Example 2 in that a supporting electrode 14*s* is provided only along a bottom surface 13*s* of the cavity 13*a* and a supporting electrode is not provided on the top surface 13*q*.

ESD protection devices of Comparative Examples 1 and 2 and the first to third preferred embodiments were manufactured to compare the ESD characteristics thereof.

Specifically, the discharge responsivity to ESD between the discharge electrodes was evaluated with 100 samples for each of the ESD protection devices. The discharge responsivity to ESD was measured using an electrostatic discharge immunity test provided in IEC61000-4-2, which is the standard of IEC. When about 2 kV to about 8 kV was applied using contact discharge, whether discharge was generated between the discharge electrodes of the samples was measured.

Table 1 shows the comparison results.

TABLE 1

Comparison of the structure of supporting electrodes

| | Supporting electrode | Discharge responsivity to ESD 2 kV | 3 kV | 4 kV | 5 kV | 6 kV | 8 kV |
|---|---|---|---|---|---|---|---|
| C. E. 1 | Bottom face | — | — | — | — | E | E |
| P. E. 1 | Bottom face and Top face | — | E | E | E | E | E |
| C. E. 2 | Bottom face | — | — | — | E | E | E |
| P. E. 2 | Bottom face and Top face | E | E | E | E | E | E |
| P. E. 3 | Bottom face and Top face | E | E | E | E | E | E |

E: ESD protective function has worked
C. E.: Comparative Example
Ex.: Example

In Table 1, the symbol "E" means that discharge was generated between the discharge electrodes of samples and an ESD protective function worked.

It is clear from the comparisons between the first preferred embodiment and Comparative Example 1 and between the second preferred embodiment and Comparative Example 2 in Table 1 that the discharge responsivity to ESD is improved when the supporting electrodes are provided along the bottom surface and the top surface of the cavity as compared to when the supporting electrode is provided only along the bottom surface.

It is also clear from the comparisons between Comparative Examples 1 and 2 and between the first and second preferred embodiments in Table 1 that the discharge responsivity to ESD is improved by making the height of the cavity equal or substantially equal to the thickness of the discharge electrodes as in the second preferred embodiment, that is, by further decreasing the height of the cavity than that in Comparative Example 1 or the first preferred embodiment. This may be because creeping discharge is generated more easily than gaseous discharge (discharge between discharge electrodes) due to a decrease in the height of the cavity.

It is also understood from the second and third preferred embodiments in Table 1 that the discharge responsivity to ESD is further improved by combining the arrangement of supporting electrodes (the arrangement of supporting electrodes to the bottom surface and the top surface) with the optimization of height of the cavity.

As described above, by providing the supporting electrodes configured to generate creeping discharge along the bottom surface and the top surface that define the cavity, the responsivity to ESD can be improved. Thus, a variation in the responsivity to ESD due to the variation in the space between the discharge electrodes is significantly reduced. Accordingly, ESD characteristics are easily adjusted and stabilized.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An ESD protection device comprising:

an insulating substrate;

a cavity provided in the insulating substrate;

at least one pair of discharge electrodes each including an exposed portion that is exposed in the cavity; and external electrodes provided on a surface of the insulating substrate and connected to the at least one pair of discharge electrodes; wherein supporting electrodes in which conductive powder is dispersed are provided along a bottom surface and a top surface that define the cavity between the exposed portions of the at least one pair of discharge electrodes.

2. The ESD protection device according to claim 1, wherein a distance between the bottom surface and the top surface that define the cavity is equal or substantially equal to a thickness of the at least one pair of discharge electrodes.

3. The ESD protection device according to claim 1, wherein the insulating substrate is a ceramic substrate.

4. The ESD protection device according to claim 1, wherein the conductive powder of the supporting electrodes is dispersed in an insulating material.

* * * * *